United States Patent [19]

Maloney et al.

[11] Patent Number: 5,548,715
[45] Date of Patent: Aug. 20, 1996

[54] ANALYSIS OF UNTESTABLE FAULTS USING DISCRETE NODE SETS

[75] Inventors: William B. Maloney, Nichols; Robert M. Mesnard, Vestal; Joseph M. Swenton, Owego, all of N.Y.

[73] Assignee: International Business Machines Corporation, Armonk, N.Y.

[21] Appl. No.: 258,166

[22] Filed: Jun. 10, 1994

[51] Int. Cl.⁶ .................................................. G01R 31/28
[52] U.S. Cl. .............................. 395/183.04; 395/183.13; 395/183.15
[58] Field of Search ......................... 395/183.04, 183.03, 395/183.05, 183.07, 183.08, 183.13, 183.15

[56] References Cited

U.S. PATENT DOCUMENTS

| | | | |
|---|---|---|---|
| 3,775,598 | 11/1973 | Chao et al. | 235/153 |
| 4,204,633 | 5/1980 | Goel | 371/27 |
| 4,551,815 | 11/1985 | Moore et al. | 364/716 |
| 4,967,347 | 10/1990 | Smith et al. | 364/200 |
| 5,184,308 | 2/1993 | Nagi et al. | 364/489 |
| 5,224,102 | 6/1993 | Plus et al. | 371/21.1 |
| 5,241,645 | 8/1993 | Cimral et al. | 395/500 |
| 5,251,159 | 10/1993 | Rowson | 364/578 |
| 5,291,495 | 3/1994 | Udell, Jr. | 371/22.3 |

FOREIGN PATENT DOCUMENTS

| | | |
|---|---|---|
| 2047439 | 7/1991 | Canada. |
| 2092880 | 3/1993 | Canada. |

*Primary Examiner*—Hoa T. Nguyen
*Attorney, Agent, or Firm*—Perman & Green

[57] ABSTRACT

This invention teaches a system (10) and method for analyzing a fault within a model of a logic circuit. The method includes the computer executed steps of (a) building a fault model of the circuit model; (b) for each modelled fault that is determined to be untestable, (b) building a discrete node set comprised of nodes of the circuit model that are relevant to the untestable fault; and (c) outputting the discrete node set for analysis. The step of building a fault model includes a step of classifying the untestable faults into at least three categories including unobservable faults, excitation conflict faults, and reverse and forward implication (RFI) conflict faults. Faults from each of these three classifications are processed differently so as to build a relevant discrete node set for subsequent analysis.

3 Claims, 12 Drawing Sheets

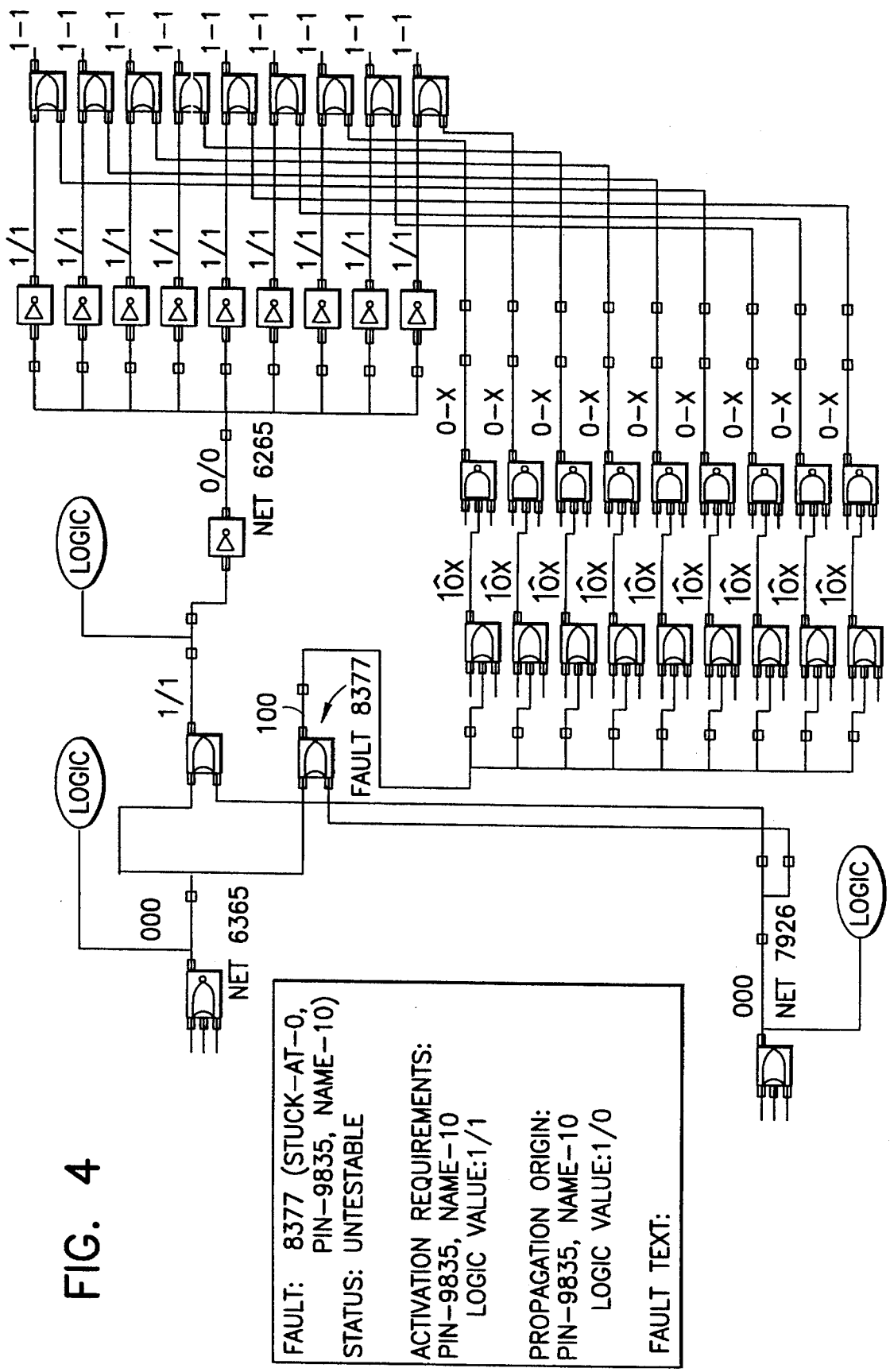

REVERSE AND FORWARD IMPLICATION

_5,548,715_

ANALYSIS OF UNTESTABLE FAULTS USING DISCRETE NODE SETS

FIELD OF THE INVENTION

This invention relates generally to electronic circuit design and test equipment and, in particular, to fault analysis techniques for use with such equipment.

BACKGROUND OF THE INVENTION

The process of identifying the underlying causes of untestable faults in logic circuits, such as circuit boards and in particular integrated circuits, has traditionally presented a difficult problem. An untestable fault can result from a number of circuit conditions, such as an inability to exercise a portion of a circuit with a circuit test system, and an inability to propagate a fault indication from the source of the fault to a point in the circuit where the fault can be detected. The wide diversity of possible circuit configurations presents a complex problem for test tool developers, since no single approach will work in all cases. The result is a notable lack of fault analysis tools within circuit design systems and, as a result, the user is typically faced with manually attempting to identify testability problems. This requires both the identification of relevant areas of a complex logic design (relevant to an untestable fault) and the elimination of non-relevant areas. As can be appreciated, this can be an extremely labor-intensive process that is prone to error.

One significant contributor to the existence of untestable faults are logical redundancies in the circuit design. Although advances in logic synthesis techniques have somewhat alleviated this problem, there continues to be a need to address untestable faults in post-synthesis circuits.

A primary goal of fault analysis is to facilitate the identification and removal of logical redundancies. The presence of redundancies can result in product failures in the presence of multiple stuck-at faults. A desirable goal is thus to identify and eliminate redundancies. Several advantages that result include, but are not limited to, a reduction in silicon area requirements and a performance improvement, especially in critical timing areas.

In addition to logical redundancies, testability problems can arise from the presence of tied logic, which may prevent a fault from propagating to a point where it can be detected, and from observability constraints that may exist in the circuit.

OBJECTS OF THE INVENTION

It is thus one object of this invention to provide a system and method that enables a user, such as a logic designer, to quickly discern circuit conditions which result in the occurrence of an untestable fault.

It is a further object of this invention to provide an automatic system for identifying the cause of an untestable fault, and for presenting a user with relevant information for analyzing and correcting the cause of the untestable fault.

A further object of this invention is to determine a concise circuit node set which, when displayed graphically, enables the user to quickly discern the reasons why a particular fault is untestable.

SUMMARY OF THE INVENTION

The foregoing and other problems are overcome and the objects of the invention are realized by a system and method for analyzing a fault within a model of a logic circuit. The method includes the computer executed steps of (a) building a fault model of the circuit model; (b) for each modelled fault that is determined to be untestable, (b) building a discrete node set comprised of nodes of the circuit model that are relevant to the untestable fault; and (c) outputting the discrete node set for analysis.

The step of building a fault model includes a step of classifying the untestable faults into at least three categories including unobservable faults, excitation conflict faults, and reverse and forward implication (RFI) conflict faults. Faults from each of these three classifications are processed differently so as to build a relevant discrete node set for subsequent analysis.

BRIEF DESCRIPTION OF THE DRAWINGS

The above set forth and other features of the invention are made more apparent in the ensuing Detailed Description of the Invention when read in conjunction with the attached Drawings, wherein:

FIGS. 3A, 3B and 3C are each a logic flow diagram that illustrate in greater detail the operation of the Build Discrete Node Set block of FIG. 1, wherein FIG. 3A illustrates the operation of the Build Discrete Node Set block for an unobservable fault condition, FIG. 3B illustrates the operation of the Build Discrete Node Set block for an excitation conflict condition, and FIG. 3C illustrates the operation of the Build Discrete Node Set block for an occurrence of an inconsistent circuit objective;

FIG. 4 illustrates a displayed discrete node set (DNS) and ancillary information for a fault effect that cannot be propagated to an observable point;

DETAILED DESCRIPTION OF THE INVENTION

Figure 1:
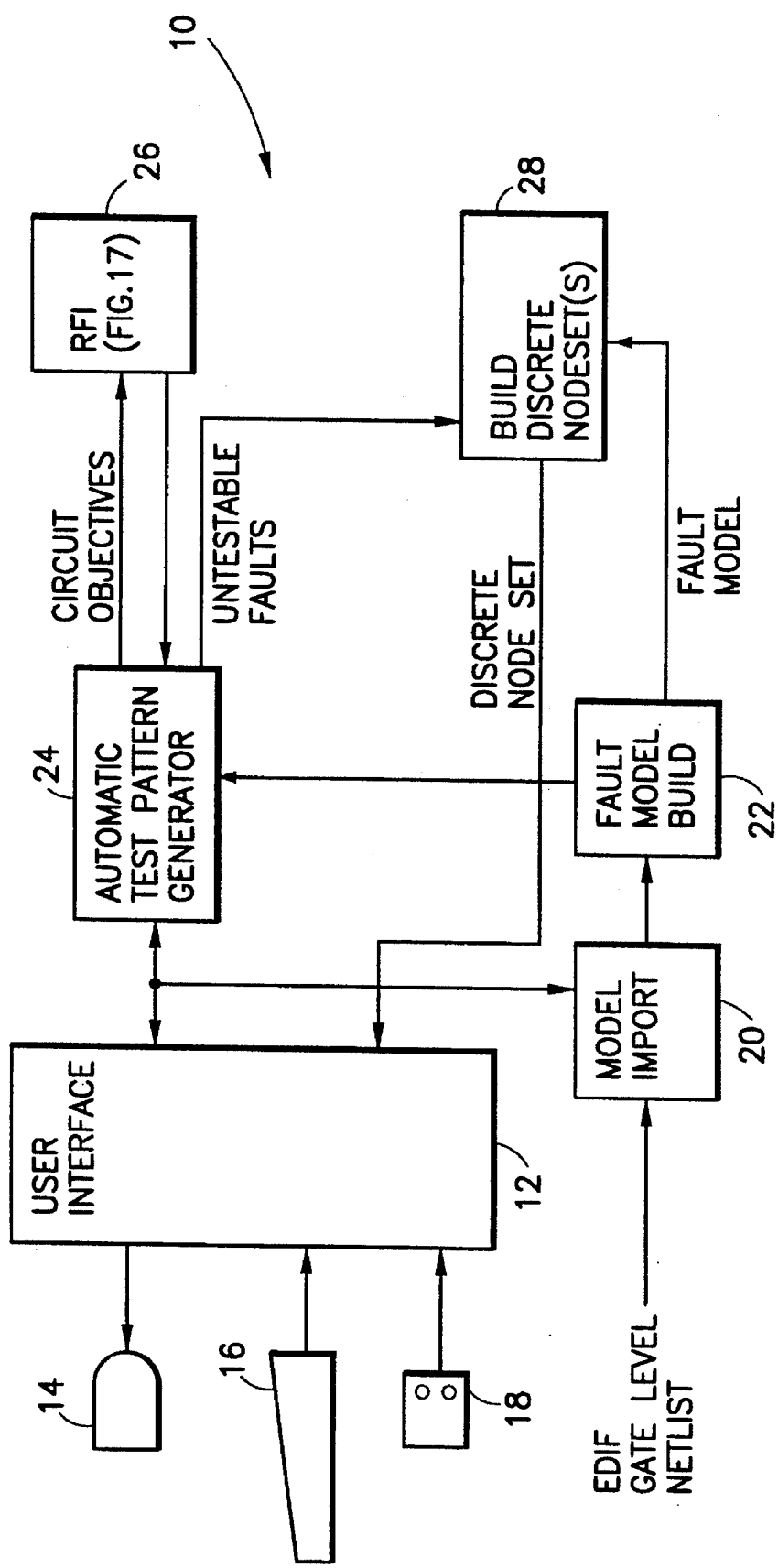
FIG. 1 is block diagram of a circuit analysis system in accordance with this invention.

FIG. 1 is block diagram of a circuit analysis system 10 in accordance with this invention. The system 10 includes a user interface 12 that is coupled to conventional user input/output devices such as a graphics display terminal 14, a keyboard 16, and a pointing device, such as a mouse 18. Through the use of the user interface 12 and the devices 14–18 a user of the system 10, such as a logic designer, is enabled to view a circuit and to interact with a fault modeling process. In accordance with this invention the user is also enabled to select one or more untestable faults to be analyzed to determine the cause of the untestability, and to subsequently view a set of circuit nodes that are determined to be relevant to the untestable condition.

The system 10 also includes a model import unit 20 that receives a description of a circuit, such as a gate level netlist in a well-known Electronic Design Interface Format (EDIF). Coupled to an output of the model input unit 20 is a fault model build unit 22 that is utilized to model faults within the imported model. These faults may include stuck-at faults resulting from pins and/or circuit nodes or nets that are connected to a particular logic level.

The system 10 also includes an automatic test pattern generator (ATPG) 24. In the presently preferred embodiment of this invention the ATPG 24 is capable of providing the following outputs: an indication that a particular modelled fault is untestable; an output list of circuit objectives, with an indication of from which portion of the ATPG process the circuit objectives originated (excitation, propagation); an output list of circuit elements at an intermediate state as defined by their signal values; an indication of the propagation paths forward from a candidate fault site; and a classification of untestable faults into specific categories. These categories include unobservable faults, excitation conflict faults, and reverse and forward implication (RFI) conflict faults, as described in greater detail below.

Coupled to the ATPG 24 is a Reverse And Forward Implication (RFI) function block 26. The RFI function block 26 operates to accept a list of circuit objectives (nodes/ desired value pairs) and to develop therefrom a circuit state defined by the signal values which result from the implication of the objectives. More particularly, the RFI function 26 operates to accept: a list of circuit objectives; indicate an inconsistency (conflict), if present in the circuit objectives; identify the circuit elements that participate in the inconsistency; and output a list of circuit elements at their final state as defined by their signal values, if no conflict is identified.

In accordance with the teaching of this invention the system 10 also includes a discrete node sets (DNS) building unit 28 that operates in accordance with this invention to construct a discrete set of circuit nodes that comprise the circuit configuration that causes a specified fault to be untestable, and to enable this node set to be displayed to the user via the user interface 12 and the graphics display terminal 14. In response, the user is enabled to examine the interconnections and circuit signal values that define the underlying cause of the untestable fault.

As was described previously these categories of untestable faults that are processed by the DNS unit 28 include unobservable faults, excitation conflict faults, and reverse and forward implication (RFI) conflict faults.

In general, unobservable faults have no valid paths to circuit outputs or memory elements. This can result from the existence of a variety of conditions. Unobservable faults may arise from signals that block all fault propagation paths, or from the absence of a topological path to circuit outputs or memory elements, or from clock faults (stuck-off) that feed non-scan memory elements, or from the existence of a logical redundancy along a propagation path.

As will be described below in reference to FIG. 3A the objective of the Discrete Node Set (DNS) building process for these type of faults is to ensure that the DNS contains only the relevant circuit domain for the fault, which includes the region of logic between the fault site and the terminal nodes. These terminal nodes can be nodes with no sinks (the logic feeds nowhere), or nodes gated by blocking signal values. In this case additional nodes are automatically added to the DNS to ensure that the user will be able to easily view terminating conditions feeding into this region. This can include nodes containing blocking signals originating external to the region, and logical redundancies that fan-in to the region and that result in terminal nodes. The origin of blocking signals can be constant value nets (e.g., tied logic), or circuit objectives.

A fault which is untestable due to excitation conflicts occurs in those circuit configurations which prevent the establishment of a circuit state required to create a difference between a fault free and faulty circuit signal value. The circuit objectives for fault excitation do not include propagation requirements. Thus, it is only necessary to establish the relationships between the conflicting circuit objectives(s) and the fault site.

A general class of untestable faults resulting from conflicts encountered during RFI is also processed to obtain a DNS. Conflicts can be discovered during RFI that are not uncovered during observability or excitation processing since additional signal values are propagated into the circuit.

So as to facilitate a more comprehensive understanding of this invention, excitation conflicts and RFI conflicts are now described in greater detail.

In general, pattern generation is a process whereby a set of circuit stimuli, at primary inputs or internal storage elements, is determined which satisfies a requested objective. In its simplest form, the objective is to obtain a requested value on a requested net. Satisfying this objective is referred to herein as "Justification", as is the process of determining the set of circuit stimuli which achieve a required value on a specified net.

Figure 6:
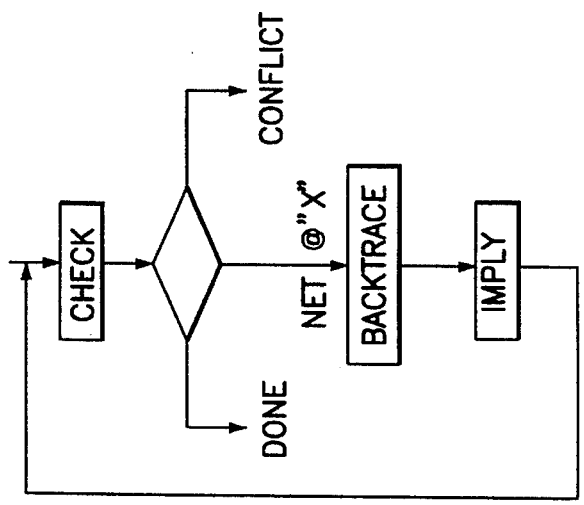
FIGS. 6–17 are useful in explaining the functioning of the Automatic Test Pattern Generator and RFI function blocks of FIG. 1.

There are a number of ways to accomplish the Justification process. One simple approach uses three basic functions: Backtrace, Imply and Check. The Justification process can be represented as a loop of these three functions, as depicted in FIG. 6.

Figure 7:
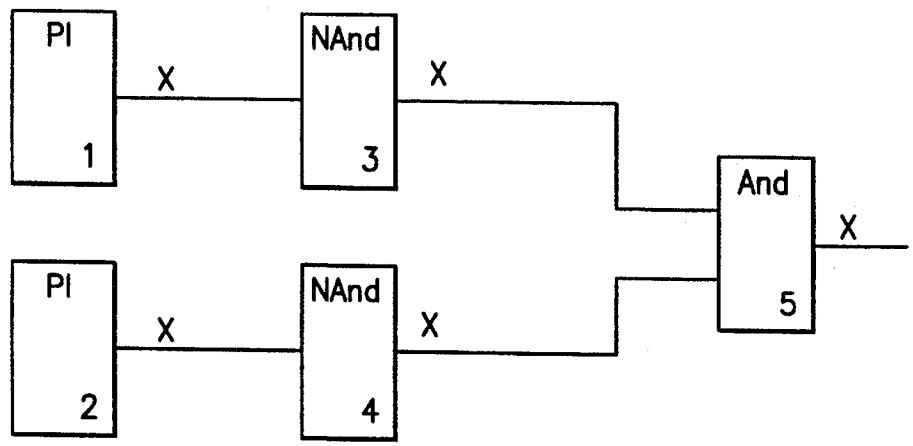

As an example, assume a case where the objective is to have net 5 in FIG. 7 at a value of "1". The first step is to perform the Check operation.

The Check procedure compares the current circuit value with the objective value. One of three results is possible:

1. The objective has been met (the requested net is now at the requested value);
2. The requested net (net 5) is still at an indeterminate ("X") value; and
3. The net is at a conflicting value (i.e., at a "0" value, but requested to be at a "1" value).

In this example, the Check operation would detect net 5 at "X", and the Justification process would continue to Backtrace.

The Backtrace function starts at the requested net and traces back along a path of indeterminate values. These values are referred to as "X" values, so this path can be described as the "X path". Tracing continues until a circuit input or internal storage element is reached, keeping track of inversion levels along the way.

Once a circuit input is encountered, and the value required on this input is determined, Backtrace completes and the Justification process proceeds to the Imply function.

The input to the Imply function is a net or list of nets to be stimulated to some value. The Imply function then simulates the implications of the net(s) in the input to their assigned values. This is referred to herein as a Forward Implication.

Figure 8:
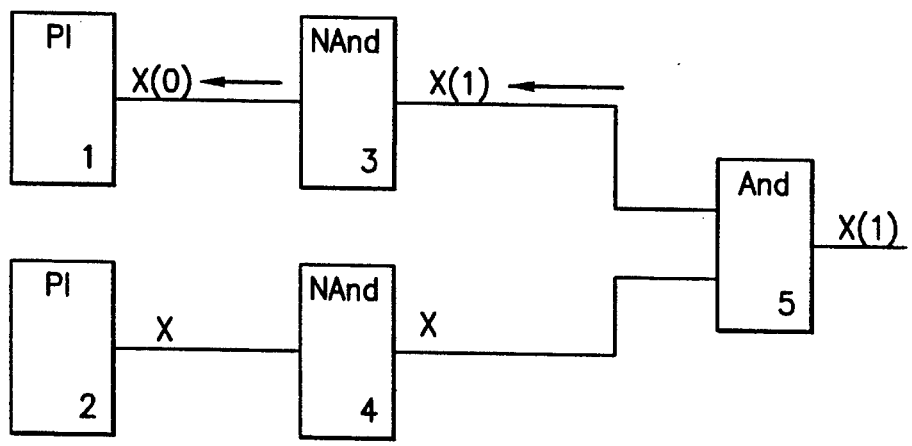

In this example, Backtrace performs the trace, as in FIG. 8, and completes at net 1, determining that a "0" value is required. This information is passed to the Imply function which then places a "0" value on net 1, and performs the forward implication function, causing the effects of this "0" value to be propagated forward.

Once Imply finishes, the loop (FIG. 6) is completed and Check is once again invoked. Now, net 5 is still at an "X" value. Backtrace is called, and a new X-Path is traversed, until net 2 is encountered. Imply is then called to propagate the effects of a "0" value on net 2, and Check is called. This time, Check detects that net 5 is at the requested value, the objective is satisfied, and the Justification process completes.

Figure 9:
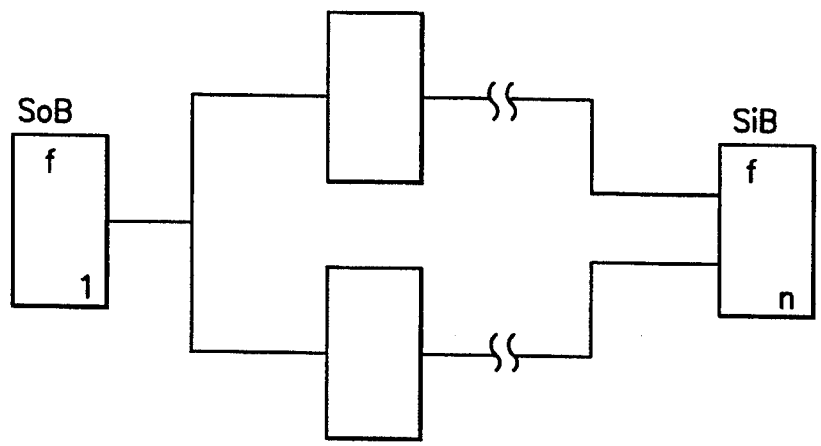

Reconvergent fanout is one circuit configuration that presents special problems to the Justification process. This configuration is shown in FIG. 9 and is characterized by a sink block ($S_IB$) which has more than one path back to a single source block ($S_OB$). When reconvergent fanout exists it is possible to have a conflict occur at the reconvergent block (block n), due to some value occurring at the fanout block (block 1). An example is shown in FIG. 10.

For this example, the objective is place net 6 at value "1". The Justification process proceeds as described above. Check determines that net 6 is at "X", so Backtrace is called. Backtrace completes at net 1, and indicates that a value "0" is required there. Imply then stimulates net 1 and propagates this effect forward. Check is again called, and now detects that a conflict exists since net 6 is now at "0", when the objective is to be at a "1". This conflict exists because Backtrace made a decision at net 4 by choosing the first input to attempt to satisfy the required value "1" at net 4. Had the Backtrace function instead chosen the second input, no conflict would have occurred and the Justification process would have achieved the goal. Net 4 is thus referred to as a Decision block because there are multiple ways to achieve the required value (a "0" on any input). Net 6 is referred to as an Imply block because, to achieve a value "1" on the And function, implies that both input nets 4 and 5 must be a value "1", hence no decision. Even though block 6 is not a decision block, the effect of Backtrace selecting the first input (net 4) also causes a conflict.

Figure 11:
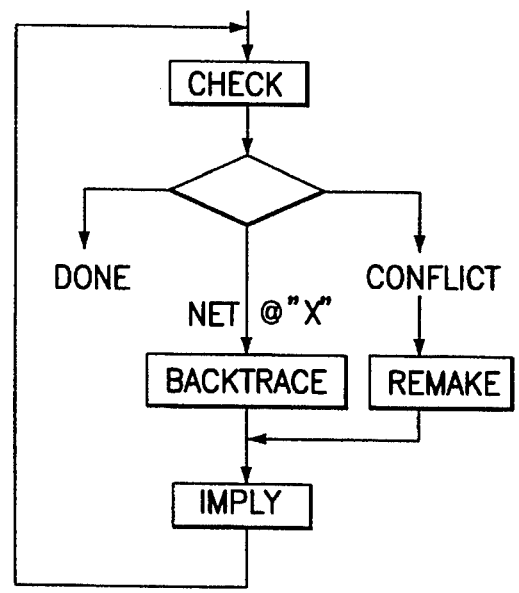

Since there is a way to achieve the objective, the Justification process allows for an incorrect decision to be "remade" so that all possibilities can be attempted before designating a particular objective as unachievable. Hence a fourth function is added to the Justification process, called Remake, as shown in FIG. 11. In general, the Remake function alters previous assignments to circuit input nets to allow alternate "X" paths to be attempted.

Figure 10:
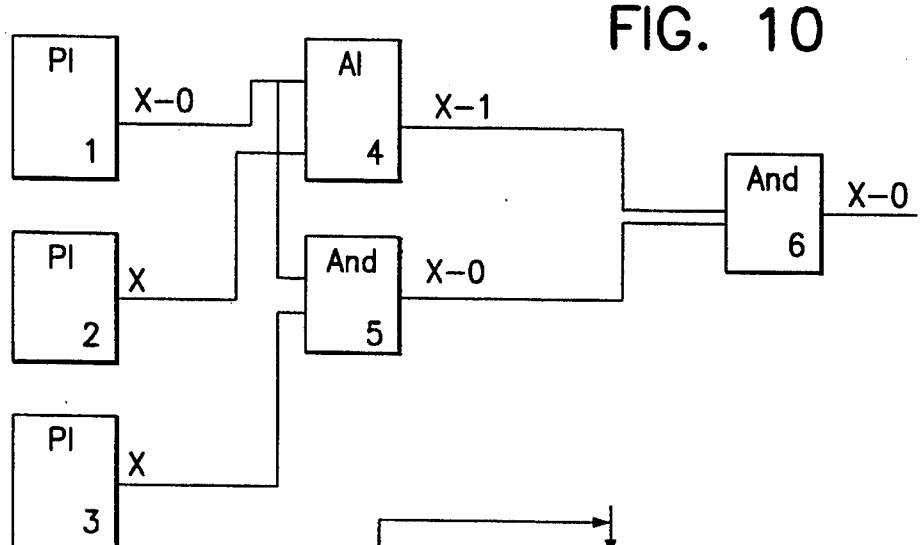

Referring again to the example of FIG. 10, when the conflict is detected, the Remake function is invoked and the decision to place a "0" on net 1 is "remade" by inverting this value to a "1". Then, when the Imply function propagates the effects of this stimulus forward, net 4, net 5 and net 6 go to "X". Now, when Check determines that the objective net (net 6) is at "X", Backtrace is called to search out another circuit input. Backtrace completes by selecting net 2 to be at "0". Imply then sets net 2 to a value "0" and propagates forward, changing net 4 to "1". Justification continues until the objective is achieved. Although, strictly speaking, the inversion of circuit input assignments is not the same as remaking decisions, it will be referred to as such herein.

For this example, the Justification process can be summarized as follows:
1. CHECK—net 6 at "X".
2. BACKTRACE—net 1 to "0".
3. IMPLY net 1 to "0"

net 4 to "1"

net 5 to "0"

net 6 to "0"
4. CHECK—detects a conflict
5. REMAKE—net 1 to "1"
6. IMPLY net 1 to "1"

net 4 to "X"

net 5 to "X"

net 6 to "X"
7. CHECK—net 6 at "X"
8. BACKTRACE—net 2 at "0" (the only input to net 4 at "X" is the second input—net 2)
9. IMPLY net 2 to "0"

net 4 to "1"
10. and so on . . .

It is pointed out that it is not sufficient for the Remake function to simply invert the most recent assignment to a circuit input. This can quickly lead to what amounts to an infinite loop, as in the example of FIG. 12.

Figure 12:
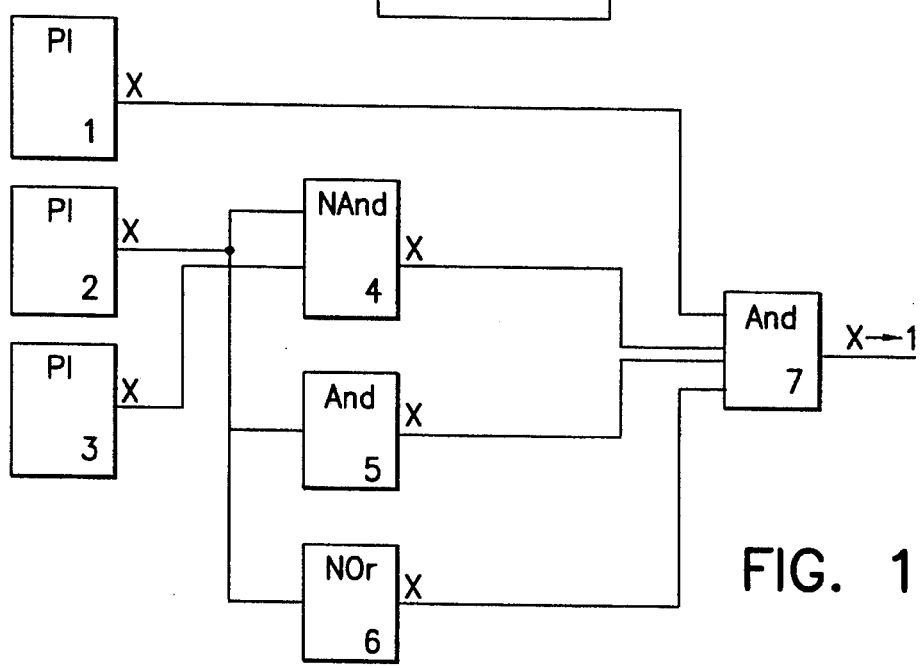

In FIG. 12 the objective is to obtain a "1" on net 7. The Justification process proceeds as follows:
1. CHECK—net 7 at "X"
2. BACKTRACE—net 1 to "1"
3. IMPLY net 1 to "1"
4. CHECK—net 7 at "X"
5. BACKTRACE—net 2 to "0"
6. IMPLY net 2 to "0"

net 4 to "1"

net 5 to "0"

net 6 to "1"

net 7 to "0"
7. CHECK—conflict detected
8. REMAKE—net 2 to "1" (inverting last input assignment)
9. IMPLY net 2 to "1"

net 4 to "X"

net 5 to "1"

net 6 to "0"
10. CHECK—conflict detected (since net 7 is still at "0")
11. REMAKE—?????

As should be apparent, if the Remake function again inverts the last input assignment (at net 2), the circuit will simply return to the first conflicting state, with net 7 at a "0". To eliminate this potential endless loop, the Remake function flags each inverted assignment to prevent another inversion. Then if Remake detects this flag as being set when attempting to invert an assignment, Remake will return the net to "X" and attempt to invert the next most recent input assignment. When all previous assignments have been inverted, the objective is deemed "unachievable". This is true since the effect of the Remake function is to allow all combinations of the circuit inputs that are required to satisfy the request. It should be noted that this function does not keep track of decision blocks, only circuit input assignments.

The foregoing example (FIG. 12) can be quickly completed. Remake sets net 2 to "X", and attempts to invert the previous input assignment. Setting net 1 to "0" forces net 7 to a "0", a conflicting condition, and the objective is determined to be unachievable.

Figure 13:
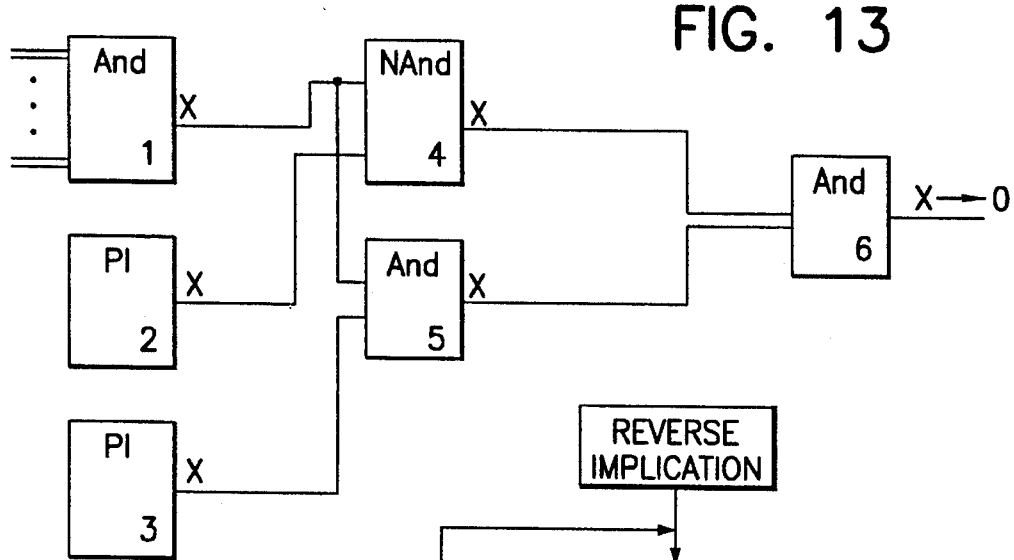

The example of FIG. 10 required only a single inversion of input assignments and, as a result, the Justification process was economically performed. However, FIG. 13 illustrates a condition wherein if instead of net 1 being a primary input, it is some logic function that has many ways to achieve the value "0" required on net 1.

As each input to net 1 achieves the value "0", the forward implication causes a conflict at net 6. As each conflict causes an input assignment to be inverted, a significant amount of Backtracing and Implication occurs on the input side of net 1, causing a performance problem, even though there is a potential solution. Because of this, pattern generation may be referred to as an NP complete problem, and all known pattern generation algorithms have a control to limit the amount of decision remaking before abandoning the Justification process. This is referred to herein as the MAXimum remade DECision limit (MAXDEC). When pattern generation is aborted due to this control, it is referred to as "hitting MAXDEC", or aborting due to MAXDEC.

The Justification process can be enhanced to eliminate the need to invert input assignments for this example by introducing the before-mentioned Reverse Implication Function (RIF).

Just as there are forward implications for those nets fed by a net that is assigned a value, there may also be implications on the nets that are feeding the objective net. Resolving these implications is referred to as Reverse or Backward Implication. Using the example network of FIG. 13, consider the implications of net 6 being requested to "1".

Net 6 must be at "1" and has a function of AND By implication, net 4 and net 5 must at "1"

Net 5 must be at "1" and has a function of AND By implication net 1 and net 3 must be at "1"

Net 1 must be at "1" and has a function of AND By implication all inputs to net 1 must at "1"

Net 4 must be at "1" and has a function of AND INVERT

Block 4 appears to be a decision block because either input at a "0" can cause the net to be at the required value of "1". But, since net 1 has been determined to be at value "1" by reverse implication of net 5, then only net 2 can be used to achieve the required value on net 4. Therefore, block 4 is not a decision block and, by implication, net 2 must be at "0".

Using this information, the Justification process can be completed without a single inversion of input assignments.

It is noted that the reverse implications of a single request can create more than one net to be required at a value. The Justification process thus processes a list of multiple requests concurrently. This list is referred to as the Multiple Request List (MRL). The only required changes to the previously defined Justification process are as follows.

1. REVERSE IMPLICATION is performed prior to justification to expand the original objective into a set of requests.

2. The CHECK function is expanded to check all of the nets in the MRL.

All nets must be at their requested value for the objective to be met.

Any net at conflicting value results in a detected conflict.

When more than one net is still at "X", CHECK must select the next to be used by the BACKTRACE function.

Figure 14:
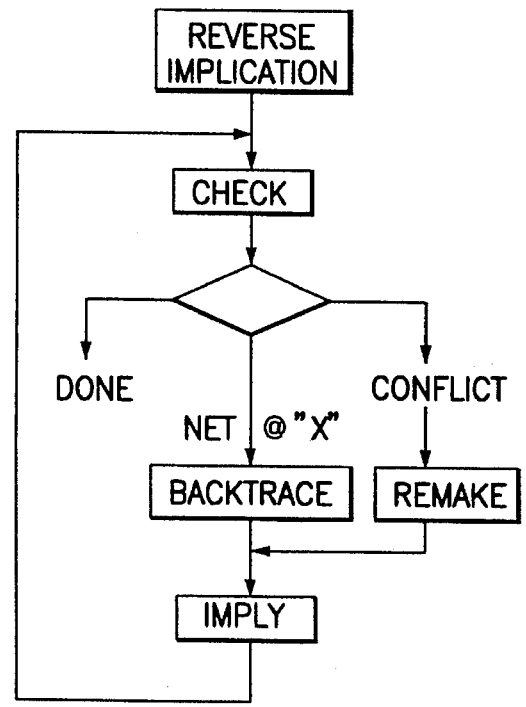

This entire process (Justification with Reverse Implication) is depicted in the logic flow diagram of FIG. 14.

Adding the RIF to the Justification process prevents the pattern generator from making arbitrary decisions that were bound to fail. By doing so, the Justification process is able to achieve the desired objective in a much more economical way. But this is not the only advantage of performing the Reverse Implication function. For example, if there is no possible resolution to a request, the Justification process without Reverse Implication would have either made and remade all possible decisions before being able to declare the request as unachievable, or aborted when reaching the MAXDEC limit. In many cases, the Reverse Implication function detects a conflict which determines that the request is unachievable without a single decision being made. Furthermore, the Reverse Implication function can completely resolve the request when all implications result in no decisions being left to be made.

The pattern generation function defined thus far is essentially complete. However, experience has shown that the Imply function is, by far, the most computationally costly portion of this Justification process. The power of using an MRL approach to enable the elimination of erroneous decisions via Reverse Implication significantly reduces the amount of Forward Implications required. As such, the performance of an application using the pattern generator can be improved by adding as many requirements (i.e., requests) as possible to the MRL before invoking the pattern generator.

To enhance the performance of the application and also to eliminate as much forward implication as possible, the pattern generator procedure is expanded to a three-step process:

1. Reverse Implication and expand MRL
2. Reverse & Forward Implication (RFI) and expand MRL
3. Justification The Justification function has been defined above.

Typically an application can enter the net index and required value directly into the MRL. The MRL is then input to the pattern generator. However, no checking is performed (unless by the application) to ensure that there are no inconsistencies within the MRL. A preferred approach is to use the Reverse Implication and expand MRL function which performs the following method steps.

1. Check for valid index.
2. Check for valid value (some values are invalid for certain block functions).
3. Check current net value against the requested value.
4. Add additional requests from reverse implications to the MRL.
5. Check additional requests to ensure that no conflicts exist with other requests.
6. Check additional requests to ensure that no conflicts exist with current circuit values.
7. Check implications for conflicts with fixed circuit values (i.e., nets tied or held to specific values).

Any conflict detected by this function limits processing time since no forward implication is performed and the application can abort the determination of further requirements.

Figure 15:
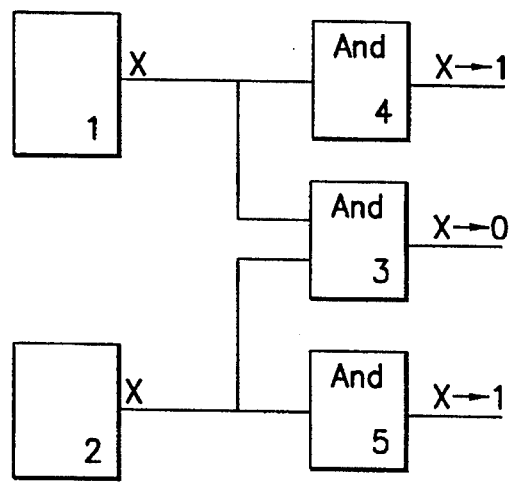

Reverse implication alone is neither sufficient to detect all possible conflicts, nor all implications. By example, and referring to FIG. 15, an application requires a "1" on nets 4 and 5, as well as a "0" on net 3.

Requesting either net 4 or 5 before requesting net 3 will result in detecting the conflict, since their reverse implications require value "1" on nets 1 or 2. Hence when net 3 is requested it is no longer a decision block, since one or both inputs are already required at a value.

But when net 3 is requested first, it is a decision block and is added to the MRL as such. Then when nets 3, 4 and 5 are requested, all appears valid since net 3 is not reevaluated.

Figure 16:
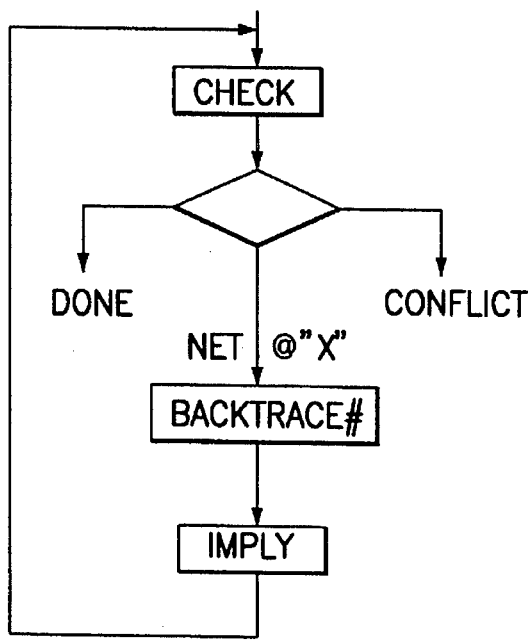

A presently preferred approach thus employs the Reverse & Forward Implications (RFI) and Expand MRL function (block 26 of FIG. 1). The RFI and Expand MRL function is comprised of several subfunctions. The first of these, Justify To Decision Block (FIG. 16) is functionally similar to Justification, except that no decisions are made, and the Remake function is not required.

As in the Justification function, the Check function searches for conflicts for all entries in the MRL and completes with one of the following conditions:

1. DONE—all nets in the MRL are at their requested values
2. CONFLICT—there is at least one requested net at a wrong value.
3. "X" NET SELECTED—a net in the MRL that is at "X" is selected as the BACKTRACE starting point.

Starting at the net selected by the Check function, the Backtrace# function traces back along an "X" path until either a circuit input is encountered or a decision net with more than one input at "X" is reached. The decision block and its required value are placed in a list to be passed to the Imply function for Forward Implication. This Imply function is identical to the Imply functional component of the Justification process.

Because assignments are made to decision blocks, a flag is set on these decision blocks prior to executing Imply function. This flag prevents the Imply function from recalculating these decision blocks back to "X" due to forward implications from other requests. This minimizes both redundant Backtracing and Implications.

The Justify To Decision Block loop concludes in one of two ways.

1. a conflicting condition—this means the procedure terminated due to a conflict. Since no decisions were made the objective is unachievable.
2. done—this indicates the objective was achieved, so all requested nets are at their requested values.

When the procedure completes as "done", each assignment decision block is recalculated to determine the effect of implications from other decision blocks. Each recalculated decision block can:

1. be at a conflicting value—justification is then terminated and the objective is unachievable; or
2. be at the requested value—the block is no longer a decision block; or
3. have a single input at "X"—the block is no longer a decision block and further reverse and forward implications can occur; or
4. remain a decision block—the block still has at least two inputs at "X".

After all decision block assignments are evaluated, the Justify To Decision Block loop is reentered if no conflicts occurred, and at least one decision block has been resolved (step 3 above).

Figure 17:
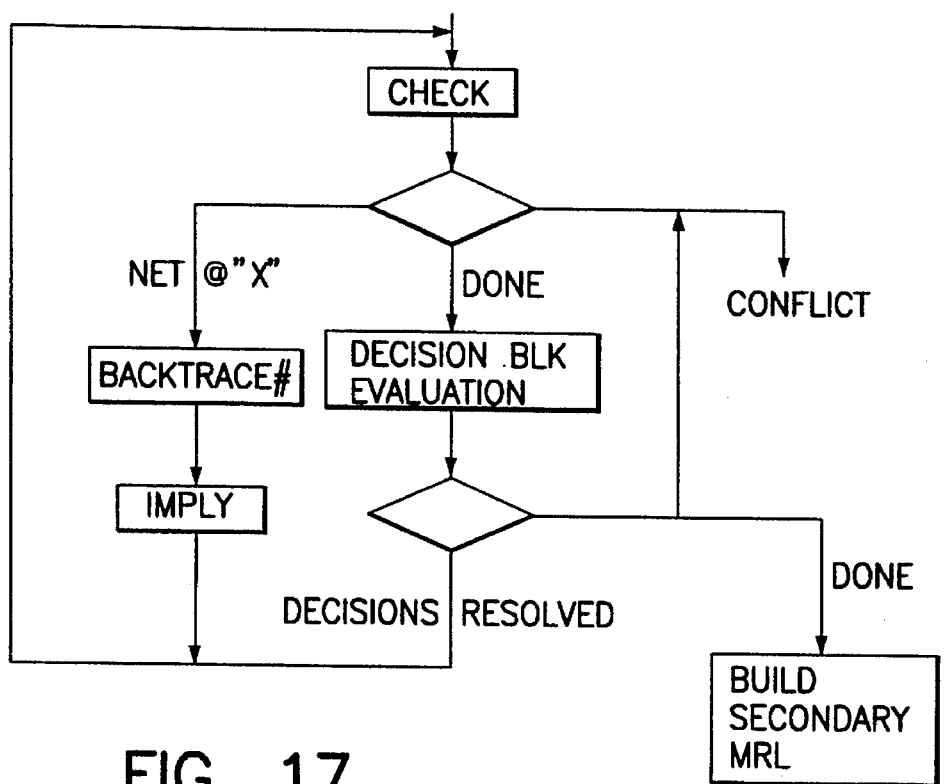

The complete Reverse and Forward Implication (RFI) and Expand MRL function processing is illustrated in FIG. 17.

It should be noted that when the Decision Block Evaluation indicates "Done", the RFI function has one more function to perform. More particularly, for every remaining decision block or circuit input an entry is made in a secondary MRL The secondary MRL is then passed on to the Justify function. If all entries in the secondary MRL are circuit inputs (i.e., no decision blocks), the original requests are considered achieved and the procedure returns an indication that the original requests have been Justified with no decision required.

Figure 2:
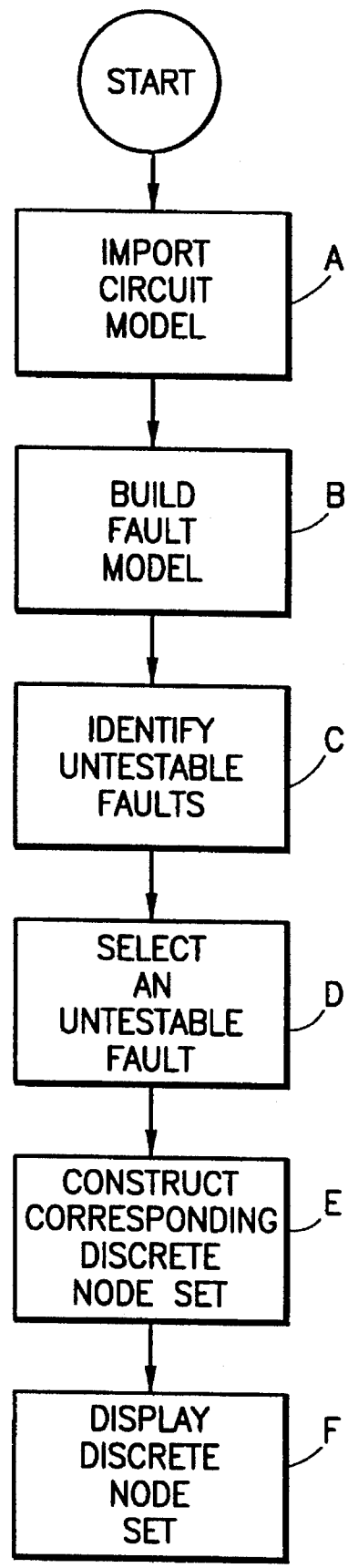
FIG. 2 is a logic flow diagram that illustrates the overall operation of the circuit analysis system of FIG. 1.

Reference is now made to FIG. 2 as showing a logic flow diagram that illustrates the overall operation of the circuit analysis system 10 of FIG. 1. The system 10 is invoked and at Block A the circuit model is imported, while at Block B the fault model is constructed. Blocks A and B can be executed by known types of techniques. At Block C the ATPG 24 is caused to execute a Deterministic Fault Analysis (DFA) function to identify untestable faults in the imported circuit model. In response, all determined testability violations are displayed to the user as a list of untestable faults, via the user interface 12 and the graphics display terminal 14. Using devices 16 and/or 18 the user selects a specific one of the untestable faults (Block D). At Block E the built discrete node set unit 28 is operated to construct the corresponding discrete node set comprising the circuit configuration that causes the fault to be untestable. At Block F the discrete node set so determined is displayed to the user for analysis.

More particularly, the ATPG 24 is invoked for a selected untestable fault and a reason code is returned which categorizes the untestable fault as unobservable, excitation conflict, or RFI conflict. These categories of untestable faults have been described in detail above.

Figure 3A:
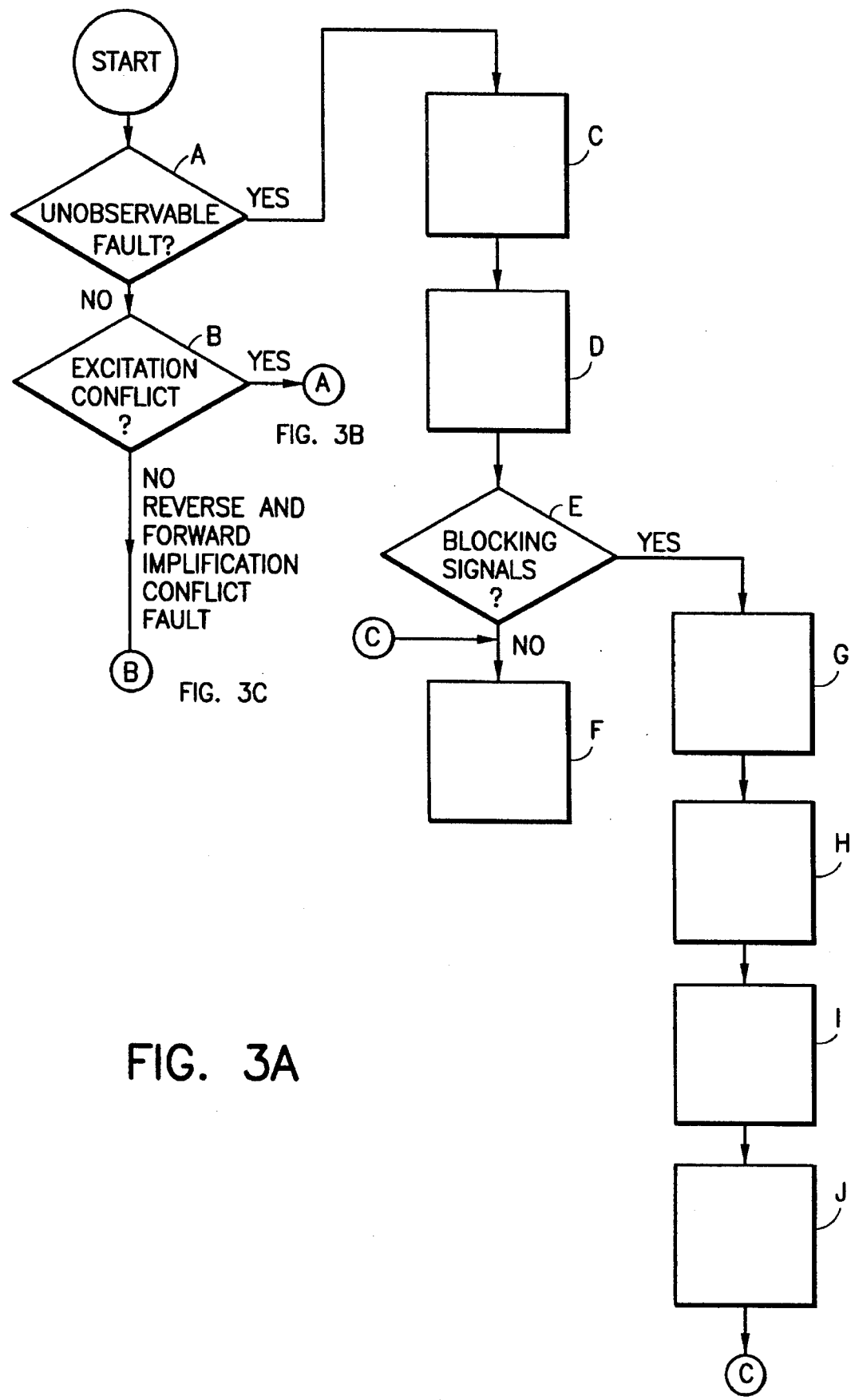

Referring to FIG. 3A, a determination is made if the untestable fault is unobservable (Block A). If Yes, the method continues at Block C. If No, a determination is made if the untestable fault is due to an excitation conflict. If Yes, the method continues via the connector A to Block K of FIG. 3B. If No, it is assumed that the untestable fault is due to an RFI conflict, and the method continues via the connector B to Block P of FIG. 3C.

Assuming now that the untestable fault is determined at Block A to be unobservable, processing continues at Block C where all terminal nodes are identified. At Block D, and starting at the fault site, all nodes occurring on paths to terminal nodes are added to the DNS. At Block E a determination is made if terminal nodes exist due to blocking signals. If No, at Block F the DNS is displayed in graphical or other form to the user via the user interface 12 for analysis by the user.

If Yes at Block E, the following additional steps are performed for the terminal nodes. At Block G all origins for blocking signals are identified and, at Block H, starting at the terminal nodes all nodes occurring on paths from blocking signal origins are added to the DNS. At Block I, and starting at blocking signal origins that are circuit objectives required for fault excitation, all nodes occurring on paths to the fault site which contain signals required for fault excitation are added to the DNS. At Block J, and starting at blocking signal origins that are circuit objectives required for fault propagation, all nodes occurring on paths to fault propagation paths which contain signals required for fault propagation are added to the DNS. Control then passes through connector C to Block F, where the DNS is displayed to the user.

Figure 3B:
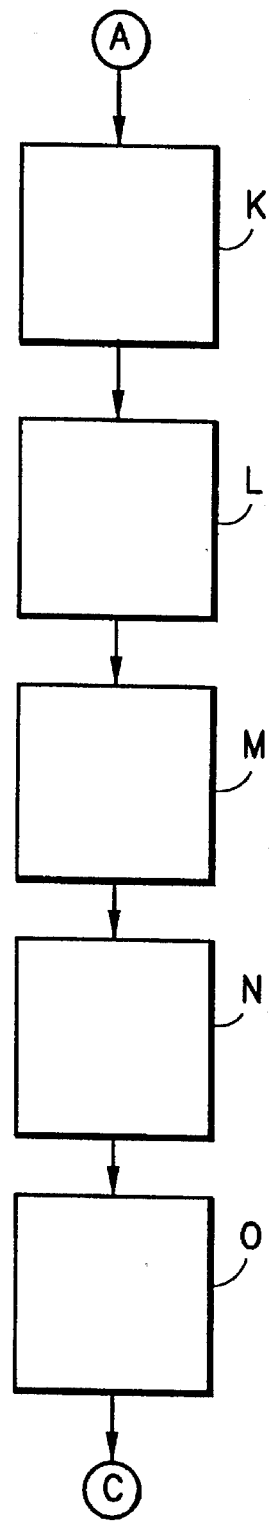

Referring now to FIG. 3B, if the untestable fault is determined to result from an excitation conflict, entry is made through the connector A. At Block K the two nodes participating in the conflict are designated as a 'conflicting node' and as a 'requesting node'. At Block L a circuit state is established which sets the conflicting node to a value consistent with the requesting node. At Block M, and starting at the conflicting node, all nodes occurring on paths to the fault site and which contain signals conflicting with those required for fault excitation are added to the DNS. At Block N, and starting at the requesting node, all nodes occurring on paths to the fault site which contain signals consistent with signals required for fault excitation are added to the DNS. Finally, at Block O, and starting at the conflicting node, all nodes occurring on paths to the requesting node are added to the DNS. Control then passes through connector C to Block F of FIG. 3A, where the DNS is displayed to the user.

Figure 3C:
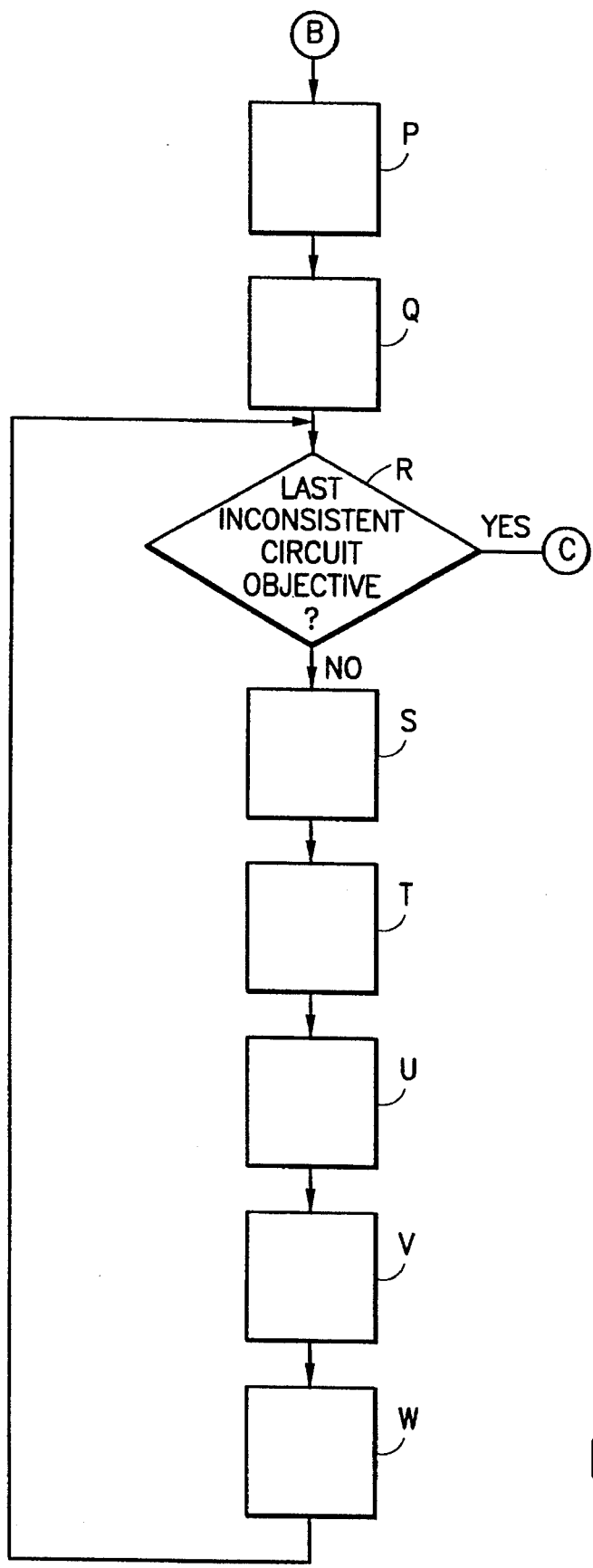

Referring now to FIG. 3C, for the case of an untestable fault resulting from an RFI conflict the DNS is constructed as follows. Entry is made through the connector B. At Block P inconsistent circuit objectives are identified, removed from the list of circuit objectives (MRL), and placed in a secondary list. At Block Q a consistent circuit state (using the pruned MRL) is established, using RFI. In this case those nodes specified by inconsistent circuit objectives will carry signal values contrary to the objective. At Block R, and for each inconsistent circuit objective, the following steps are performed. At Block S all origins for contrary signals on inconsistent nodes are identified. At Block T, and starting at contrary signal origins, all nodes occurring on paths to the inconsistent node, and which contain controlling signals, are added to the DNS. At Block U, and starting at an inconsistent circuit objective required for fault excitation, all nodes occurring on paths to the fault site which contain signals contrary to fault excitation are added to the DNS. At Block V, and starting at an inconsistent circuit objective required for propagation of the fault, all nodes occurring on paths to fault propagation paths, and which contain signals contrary to fault propagation, are added to the DNS. Finally, at Block W, for each origin of contrary signals that are also circuit objectives, the relationship between that objective and the fault is defined as follows. If the objective is due to fault excitation requirements, all nodes (including the origin) occurring on paths to the fault site containing signals required for fault excitation are added to the DNS. Otherwise, if the objective is due to propagation requirements, all nodes (including the origin) occurring on paths to the fault propagation path containing signals required for propagation are added to the DNS. Blocks S through W are repeated for each inconsistent circuit objective until all inconsistent circuit objectives are processed, at which time control passes through connector C to Block F of FIG. 3A, where the DNS is displayed to the user.

FIG. 4 is an example of a user display of a DNS for an untestable fault that results from a fault that cannot be propagated to an observable point. More particularly, a message indicates to the user that fault 8377 cannot be propagated to an observable point. As can be observed at the right side of the Figure, all nine nets are at state 1-1. That is, there is no observable difference between a good circuit and a faulty circuit and, as a result, fault 8377 is not detectable.

The second (lower) input to each of the nine output blocks has the potential to carry a valid fault signal by obtaining a 1 in place of an x. However, the first (upper) input of each of these nine blocks carries a 1/1 signal, which blocks the propagation of the fault signal. These inputs are all controlled by a common source (net 6265). Net 6265 is at 0/0 because both net 6365 and net 7926 are required to be 0/0 to activate the fault. However, and as already noted, the 0/0 state applies a controlling signal (1/1) to all propagation paths for the fault signal, thereby making this fault untestable.

The displayed DNS thus provides valuable information to the user as to the identity and the cause of the untestable fault at net 8377.

Figure 5A:
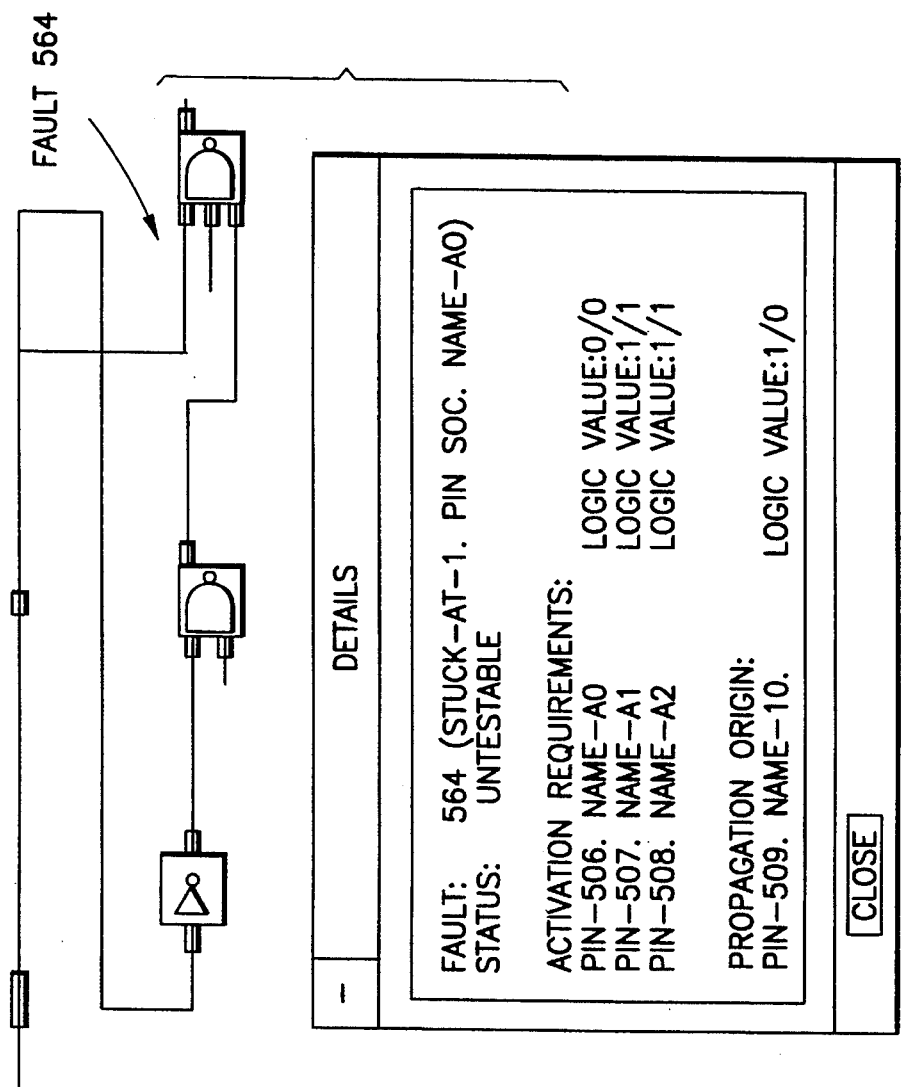
FIGS. 5A, 5B and 5C illustrate a displayed DNS with a window function selected; the DNS with annotated fault, pin, net indexes, and logic values; and the DNS with net indexes and logic values after backtracing, respectively, for an untestable fault due to an excitation conflict and a logical redundancy.
Figure 5B:
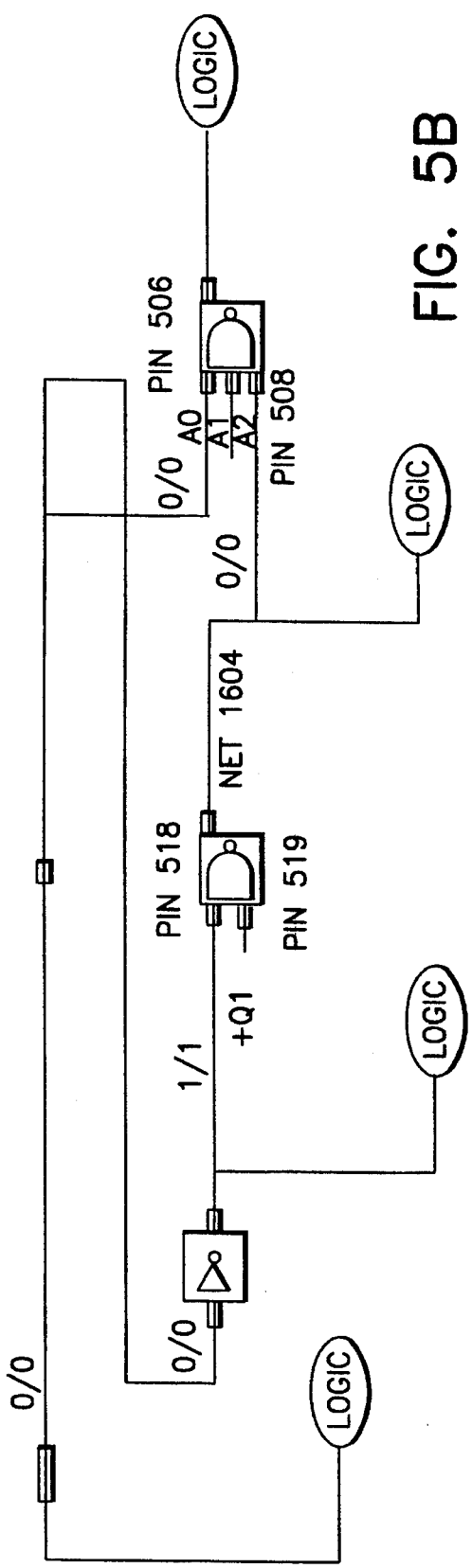
Figure 5C:
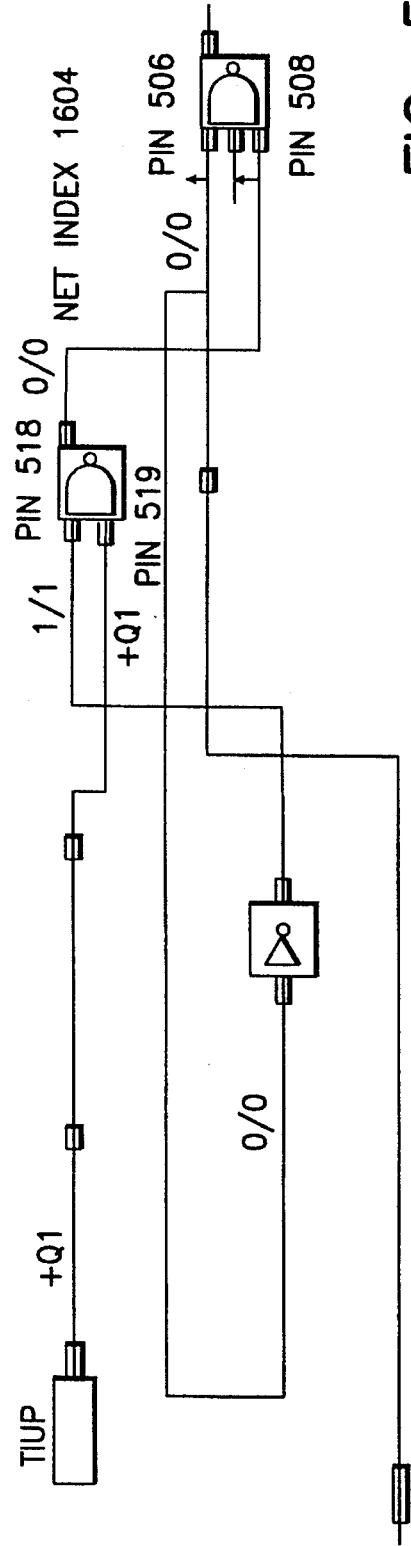

FIGS. 5A, 5B and 5C illustrate the DNS with a window function selected, with annotated fault, pin, net indexes, and logic values, and the net indexes and logic values after backtracing, respectively, for an untestable fault 564 due to an excitation conflict and a logical redundancy.

The procedure for analyzing the untestable fault 564 is as follows. As is evident from the displayed DNS, (FIG. 5B) there is a mismatch in values for pin 508 (A2). Pin 508 (A2) is at 0/0, but according to the activation requirements shown in the window (FIG. 5A), pin 508 (A2) must be at 1/1. This discrepancy exists since pin 519 (A1) is controlled to a 1 because of a TIUP block. Thus, the 1/1 on pin 518 (A0) drives the output at net 1604 to 0/0 which causes pin 508 (A2) to be at 0/0. Backtracking further, pin 518 is at 1/1 because net index 1604 must be at 0/0 to place a 0/0 on pin 506 (A0) of the fault block. However, this also drives pin 518 to 1/1. As a result, the fault 564 is untestable in that pin 506 (A0) being set to 0/0 drives pin 508 (A2) to 0/0. Thus, the activation requirements to test fault 564 cannot be achieved because of this redundancy in the logic.

FIG. 5C shows the displayed DNS after backtracing on pin 519. It is noted that the backtrace is not required for the analysis of this fault. However, backtracing explains why pin 519 is required to be a 1 (+Q1). That is, the TIUP block is displayed to the user as a part of the DNS.

Although described in the context of providing a graphical display to a human operator, for example a logic designer, it should be realized that the discrete node set may be stored for later analysis. Furthermore, it is envisioned that the discrete node set could be input to a software program, such as an expert system, for automatic analysis of the discrete node set and for the determination of possible corrective action. Furthermore, certain of the steps of the method shown in FIGS. 2 and 3A–3C could be executed in other than the order shown while still obtaining the same result. In addition, it should be realized that all or some of the blocks depicted in FIGS. 2 and 3A–3C can be replaced with a hardware embodiment of a logic function for performing the indicated step. As such, these logic flow diagrams can also be read as system block diagrams.

Thus, while the invention has been particularly shown and described with respect to a preferred embodiment thereof, it will be understood by those skilled in the art that changes in form and details may be made therein without departing from the scope and spirit of the invention.

Having thus described our invention, what we claim as new, and desire to secure by Letters Patent is:

1. A method for analyzing a fault within a model of a logic circuit, comprising the computer executed steps of:

building a fault model of the circuit model;

for each modelled fault that is determined to be untestable, building a discrete node set comprised of nodes of the circuit model that are relevant to the untestable fault; and outputting the discrete node set for analysis;

wherein for a fault classified as an unobservable fault, the step of building the discrete node set includes the steps of:

identifying all terminal nodes associated with the unobservable fault;

starting at the site of the unobservable fault, adding to the discrete node set all nodes occurring on paths to the identified terminal nodes;

determining if any terminal nodes exist due to blocking signals and, if no, executing the step of outputting the discrete node set for analysis, else, if yes, identifying all origins for the blocking signals;

starting at the terminal nodes, adding to the discrete node set all nodes occurring on paths from the identified blocking signal origins;

starting at the determined blocking signal origins that are circuit objectives required for exciting the unobservable fault, adding to the discrete node set all nodes, occurring on paths to the site of the unobservable fault, that contain signals required for exciting the unobservable fault;

and starting at blocking signal origins that are circuit objectives required for propagating the unobservable fault, adding to the discrete node set all nodes that occur on paths to the fault propagation paths and which contain signals required for fault propagation; and executing the step of outputting the discrete node set for analysis.

2. A method for analyzing a fault within a model of a logic circuit, comprising the computer executed steps of:

building a fault model of the circuit model;

for each modelled fault that is determined to be untestable, building a discrete node set comprised of nodes of the circuit model that are relevant to the untestable fault; and outputting the discrete node set for analysis;

wherein for a fault classified as an excitation conflict fault, the step of building the discrete node set includes the steps of:

designating two nodes participating in the excitation conflict as a conflicting node and as a requesting node;

establishing a circuit state which sets the conflicting node to a value that is consistent with the requesting node;

starting at the conflicting node, adding to the discrete node set all nodes that occur on paths to the site of the excitation conflict fault and which contain signals conflicting with those required for fault excitation at the conflicting node;

starting at the requesting node, adding to the discrete node set all nodes that occur on paths to the site of the excitation conflict fault and which contain signals consistent with signals required for fault excitation;

starting at the conflicting node, adding to the discrete node set all nodes that occur on paths to the requesting node; and executing the step of outputting the discrete node set for analysis.

3. A method for analyzing a fault within a model of a logic circuit, comprising the computer executed steps of:

building a fault model of the circuit model;

for each modelled fault that is determined to be untestable, building a discrete node set comprised of nodes of the circuit model that are relevant to the untestable fault; and outputting the discrete node set for analysis;

wherein for a fault classified as an RFI conflict fault, the step of building the discrete node set includes the steps of:

identifying all inconsistent circuit objectives and removing the identified inconsistent circuit objectives from a list of circuit objectives, thereby pruning the list of circuit objectives;

using an RFI function, establishing a consistent circuit state from the pruned list of circuit objectives, whereby circuit nodes specified by inconsistent circuit objectives will carry signal values contrary to the circuit objective; and for each inconsistent circuit objective, performing the steps of, identifying all origins for contrary signal values on inconsistent nodes;

starting at origin nodes of the contrary signal values, adding to the discrete node set all nodes that occur on paths to the inconsistent node, and which contain controlling signals;

starting at an inconsistent circuit objective required for exciting the RFI conflict fault, adding to the discrete node set all nodes that occur on paths to the site of the RFI conflict fault, and which contain signals contrary to exciting the RFI conflict fault;

starting at an inconsistent circuit objective required for propagation of the RFI conflict fault, adding to the discrete node set all nodes that occur on paths to propagation paths of the RFI conflict fault, and which contain signals contrary to fault propagation;

for each origin of contrary signals that are also circuit objectives, defining a relationship between that objective and the RFI conflict fault and:

if the circuit objective is due to fault excitation requirements, adding to the discrete node set all nodes (including the origin) that occur on paths to the fault site and that contain signals required for fault excitation;

else, if the circuit objective is due to fault propagation requirements, adding to the discrete node set all nodes (including the origin) that occur on paths to the fault propagation path and that contain signals required for propagating the fault; and executing the step of outputting the discrete node set for analysis.

* * * * *